United States Patent
Lehman, Jr.

(10) Patent No.: US 7,217,600 B2
(45) Date of Patent: May 15, 2007

(54) CYCLIC OLEFIN POLYMERS AND CATALYST FOR SEMICONDUCTOR APPLICATIONS

(75) Inventor: Stephen E. Lehman, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 342 days.

(21) Appl. No.: 10/976,627

(22) Filed: Oct. 29, 2004

(65) Prior Publication Data
US 2006/0094258 A1  May 4, 2006

(51) Int. Cl.
*H01L 21/56* (2006.01)
*B05D 3/10* (2006.01)

(52) U.S. Cl. ................. 438/127; 438/780; 438/781; 427/385.5

(58) Field of Classification Search .......... 438/127, 438/781, 780; 427/385.5
See application file for complete search history.

(56) References Cited

U.S. PATENT DOCUMENTS 5,286,439 A * 2/1994 Shinohara .............. 264/272.15
2002/0139975 A1 * 10/2002 Lewis et al. ............... 257/40
2006/0106174 A1 * 5/2006 Ohkita et al. ............. 525/342

OTHER PUBLICATIONS

Melanie S. Sanford, et al., "A Versatile Precursor for the Synthesis of New Ruthenium Olefin Metathesis Catalysts," Organometallics 2001, pp. 5314-5318, vol. 20, No. 25, American Chemical Society.
Melanie S. Sanford, et al., "Mechanism and Activity of Ruthenium Olefin Metathesis Catalysts," J. Am. Chem. Soc. 2001, pp. 6543-6554, vol. 123, No. 27, American Chemical Society.
Tina M. Trnka, et al., "Synthesis and Activity of Ruthenium Alkylidene Complexes Coordinated with Phosphine and N-Heterocyclic Carbene Ligands," J. Am. Chem. Soc. 2003, pp. 2546-2558, vol. 125, No. 9, American Chemical Society.

* cited by examiner

*Primary Examiner*—Fred Teskin
(74) *Attorney, Agent, or Firm*—Blakely, Sokoloff, Taylor & Zafman LLP

(57) ABSTRACT

An embodiment is a cyclic olefin semiconductor package. Further an embodiment is a combination of a cyclic olefin monomer and a ruthenium-based catalyst that is stable at approximately room temperature and humidity for extended storage life and pot life, and that can be screen printed or valve/jet deposited.

14 Claims, 10 Drawing Sheets

CYCLIC OLEFIN POLYMERS AND CATALYST FOR SEMICONDUCTOR APPLICATIONS

FIELD

Embodiments of the invention relate to semiconductor polymer packaging and in particular to a semiconductor polymer packaging material and process amenable to low temperature processing.

BACKGROUND

There is a need for alternative polymer technologies that are compatible with existing epoxy resin process flows for semiconductor and semiconductor packaging. Ring-Opening Metathesis Polymerization (ROMP) is a well-known mode of polymerization that can form useful thermoplastic and thermoset materials for a variety of semiconductor applications. The materials can be wholly hydrocarbon or can contain polar functional groups, and the cure rate can be very rapid. The dielectric constant is intrinsically low for many of these materials, allowing compatible integration into other low-k processes. ROMP is promoted by transition metal catalysts. These catalysts have historically been air, moisture, and temperature sensitive, which limits the polymerization processes to those that are amenable to air and moisture free conditions or to processes in which the polymerization occurs at a rate greater than the rate of decomposition of the catalyst.

Additionally, the rate of ROMP at room temperature with commonly used catalysts is quite rapid for strained cyclic olefins, which prevents formulation of one-part mixtures of cyclic olefin monomers and metathesis catalysts. ROMP of dicyclopentadiene (DCPD, $C_{10}H_{12}$), for example, forms a rigid crosslinked polymer when polymerized, but the rate of reaction is so fast that mixtures of dicyclopentadiene and metathesis catalysts are not stable; polymerization of DCPD would spontaneously occur for most metathesis catalysts. This aspect of the current art prevents the preparation of curable mixtures of strained cyclic olefins and metathesis catalysts for use most processes related to electronics packaging.

The sensitivity of metathesis catalysts and the rapid rate of ROMP of strained cyclic olefins at room temperature require handling and processing procedures that are amenable to very rapid polymerization and cure and that keep the monomer separated from the catalyst until just prior to the polymerization. DCPD, for example, is most often polymerized and processed into parts via reaction injection molding (RIM) or resin transfer molding (RTM). Typically a solution of precatalyst in liquid DCPD is mixed with a solution of catalyst activator in DCPD, which initiates the polymerization. The mixture is then pumped into a mold where the polymerization continues to form the final crosslinked part.

DETAILED DESCRIPTION

Figure 1:
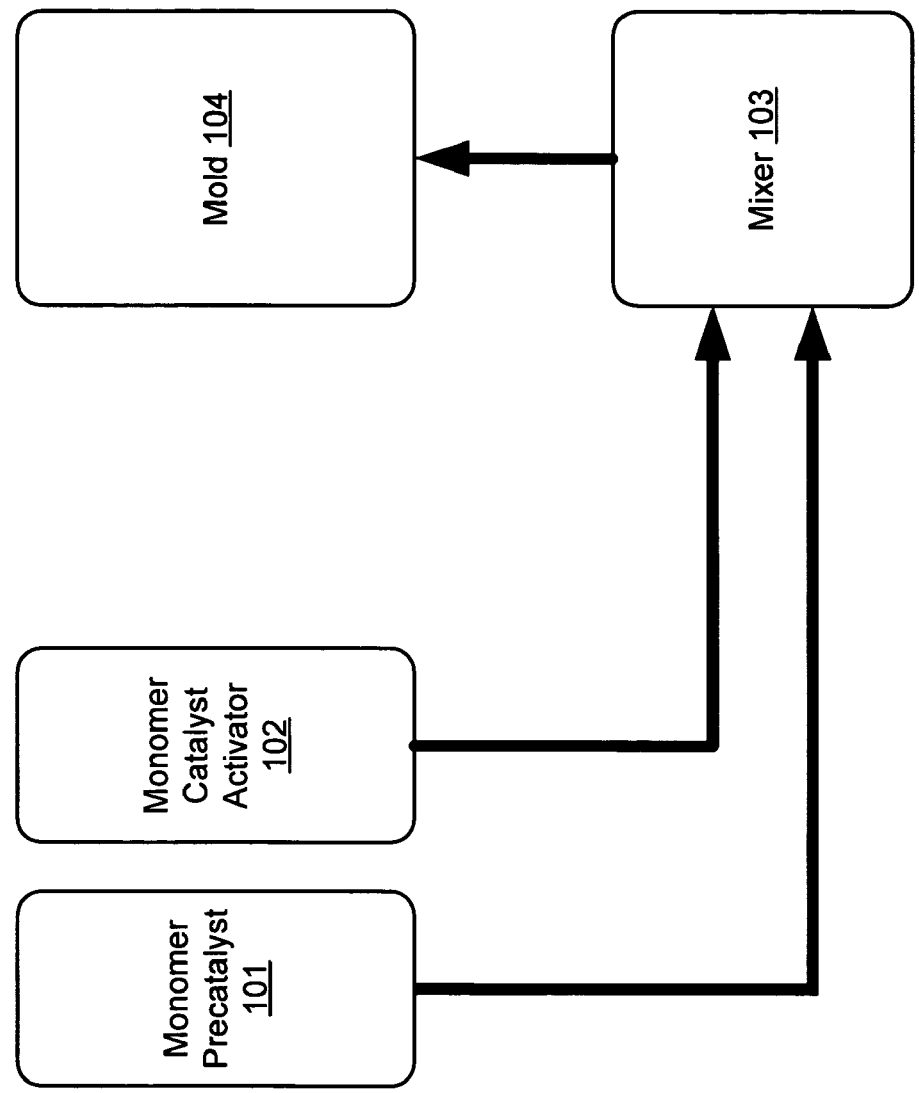
FIG. 1: illustration of a reaction injection molding process

Embodiments of a cyclic olefin polymer and catalyst for semiconductor applications will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment is a cyclic olefin semiconductor package. Further an embodiment is a combination of a cyclic olefin monomer and a ruthenium-based catalyst that is stable at approximately room temperature and humidity for extended storage life and pot life, and that can be screen printed or valve/jet deposited.

FIG. 1 illustrates the RIM process used for ROMP polymerization of strained cyclic olefin. In an embodiment, a tank contains a monomer precatalyst 101 and another tank contains a monomer catalyst activator 102. Alternatively, one tank could contain monomer and the other could contain monomer, catalyst, and a retarding agent to retard the rate of polymerization. In an embodiment, the monomer precatalyst 101 and the monomer catalyst activator 102 are combined in a mixer 103 and directed to a mold 104 to create a geometry in which the polymerization can proceed until the stained cyclic olefin polymer is formed.

Figure 2:
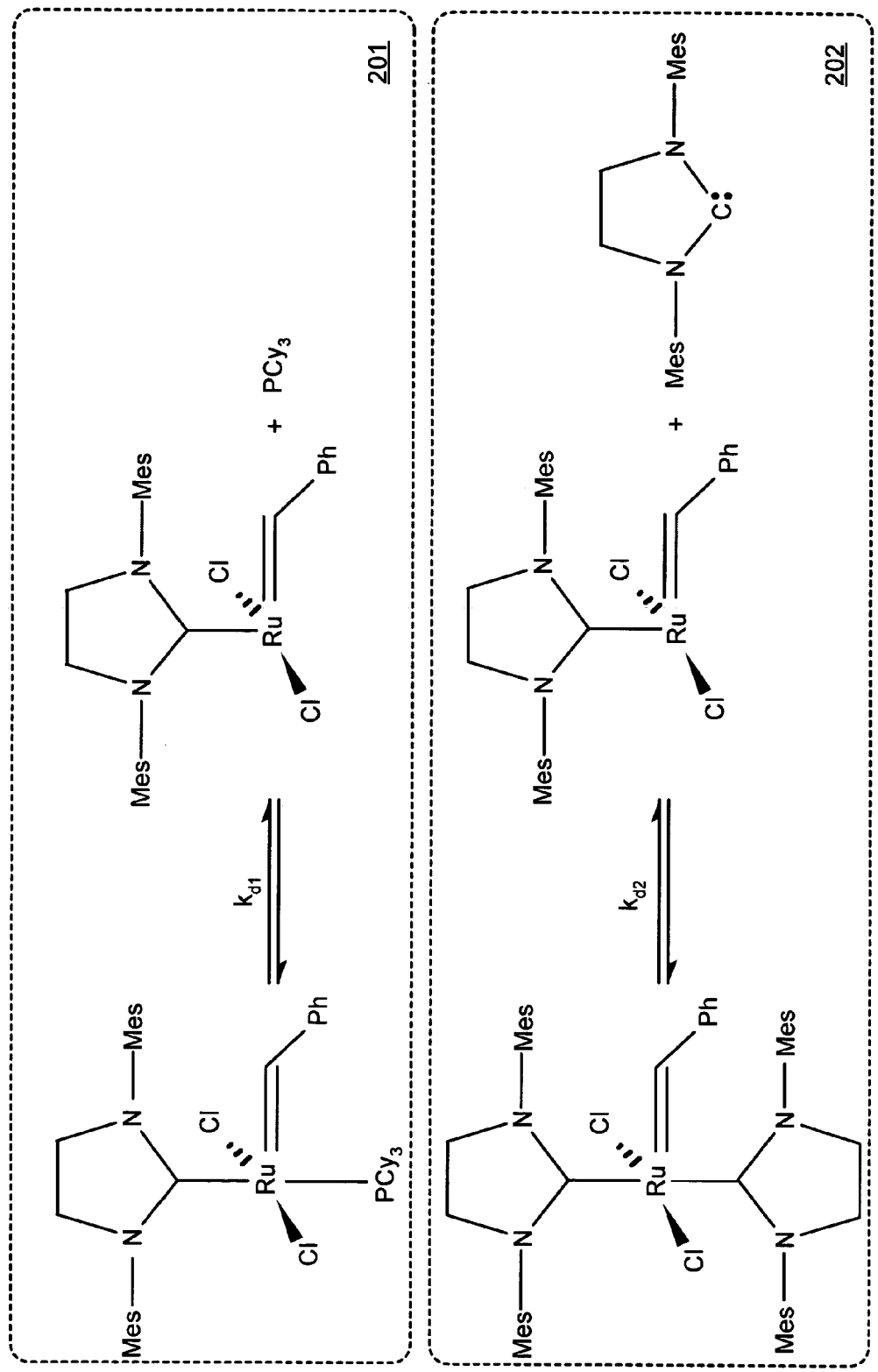
FIG. 2: illustration of a chemical reaction mechanism of two ruthenium-based catalysts

FIG. 2 illustrates two ruthenium-based catalytic mechanisms for olefin metatheisis. The illustrated catalysts possess ligands that prevent polymerization initiation at room temperature, yet allow rapid polymerization at elevated temperatures. This feature allows the preparation of one-part mixtures of cyclic olefins and catalyst that are stable at room temperature. Furthermore, these catalysts are substantially stable to moisture and oxygen, such that the preparation of mixtures of cyclic olefins and the catalysts could be carried out using standard procedures (e.g., atmospheric temperature and humidity) and the mixtures would have a reasonable shelf life and pot life.

In particular, ruthenium-based catalyst 202 is based on a ruthenium complex $RuCl_2L_2CHR$ where L is a ligand of the type N-heterocyclic carbene (NHC), and specifically 1,3-bismesityl-4,5-dihydroimidazol-2-ylidene (SIMes). Alternatively, ruthenium-based catalyst 201 includes the ligand tricyclohexylphosphine ($PCy_3$). Unlike ruthenium-based catalyst 201, ruthenium-based catalyst 202 is inactive for ROMP at room temperature but becomes an active catalyst when heated to approximately 80° C. The NHC ligand (SIMes) of ruthenium-based catalyst 202 makes a strong sigma bond to the ruthenium center that increases the energy required for dissociation of the NHC ligand compared to that of the $PCy_3$ ligand of ruthenium-based catalyst 201. Said differently, the rate constant $k_{d1}$ for the ligand dissociation reaction for the PCy$_3$ dissociation of ruthenium-based catalyst 201 is much larger than the rate constant $k_{d2}$ for the ligand dissociation reaction for NHC for ruthenium-based catalyst 202. Accordingly, the temperature at which the ruthenium-based catalyst 202 becomes active is higher than the temperature at which the ruthenium-based catalyst 201 becomes active. The dissociation of the ligand (i.e., PCy$_3$ or NHC for ruthenium-based catalytic mechanisms 201 and 202 respectively) is required to initiate the metathesis polymerization. The slow dissociation of the NHC ligand further may increase the stability of the ruthenium-based catalyst when exposed to air.

The strong NHC-ruthenium bond of ruthenium-based catalyst 202 (versus the weaker ruthenium-phosphine bond of ruthenium-based catalyst 201) gives the catalyst air stability at room temperature and further prevents spontaneous polymerization of cyclic olefins at room temperature, both of which are important as introduced above. Additionally, the temperature at which metathesis is initiated by ruthenium-based catalytic mechanism 202 can be modulated by the identity of the NHC ligand. More specifically, for less sterically bulky the N-substituents, spontaneous polymerization will require a higher temperature. Said differently, the selection of the N-substituent can tune, among other features, the temperature at which the spontaneous polymerization occurs to construct a catalyst that has a high enough activation temperature to be commercially practicable while low enough to be compatible with semiconductor devices that are sensitive to high temperature process steps.

Figure 3:
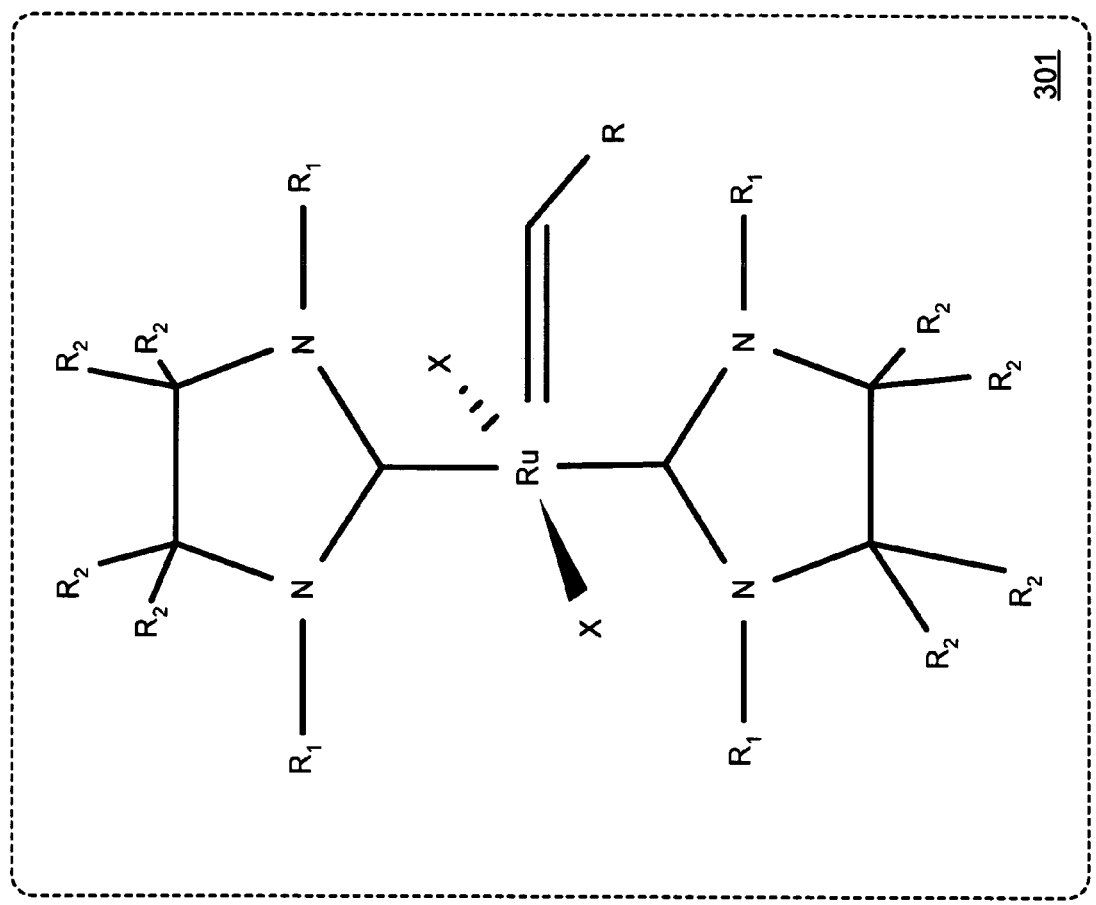
FIG. 3: illustration of a general chemical structure of a ruthenium-based catalyst

FIG. 3 illustrates a general ruthenium-based catalyst 301 structure. In particular, the ruthenium-based catalyst has general formula RuX$_2$L$_2$CR1R2, where X is independently chosen from halogens or alkoxide groups, L is a member of the imidazol-2-ylidene ligand group with N-substituents, R1 and the imidazol-2-ylidene ring substituents R2 are independently chosen from hydrogen, aryl, and branched and linear alkyl groups from 1–20 carbons and C3 and C4 of the imidazol-2-ylidene ring may be connected by a single or double bond and are substituted with groups independently chosen from hydrogen, aryl, ester, carboxylic acid, amine, amide, or linear or branched hydrocarbon from 1–20 carbons. Further, R represents an aryl, substituted aryl, branched or linear alkyl groups from 1–20 carbons, ester, aldehyde, ketone, amide, or hydrogen.

Figure 4:
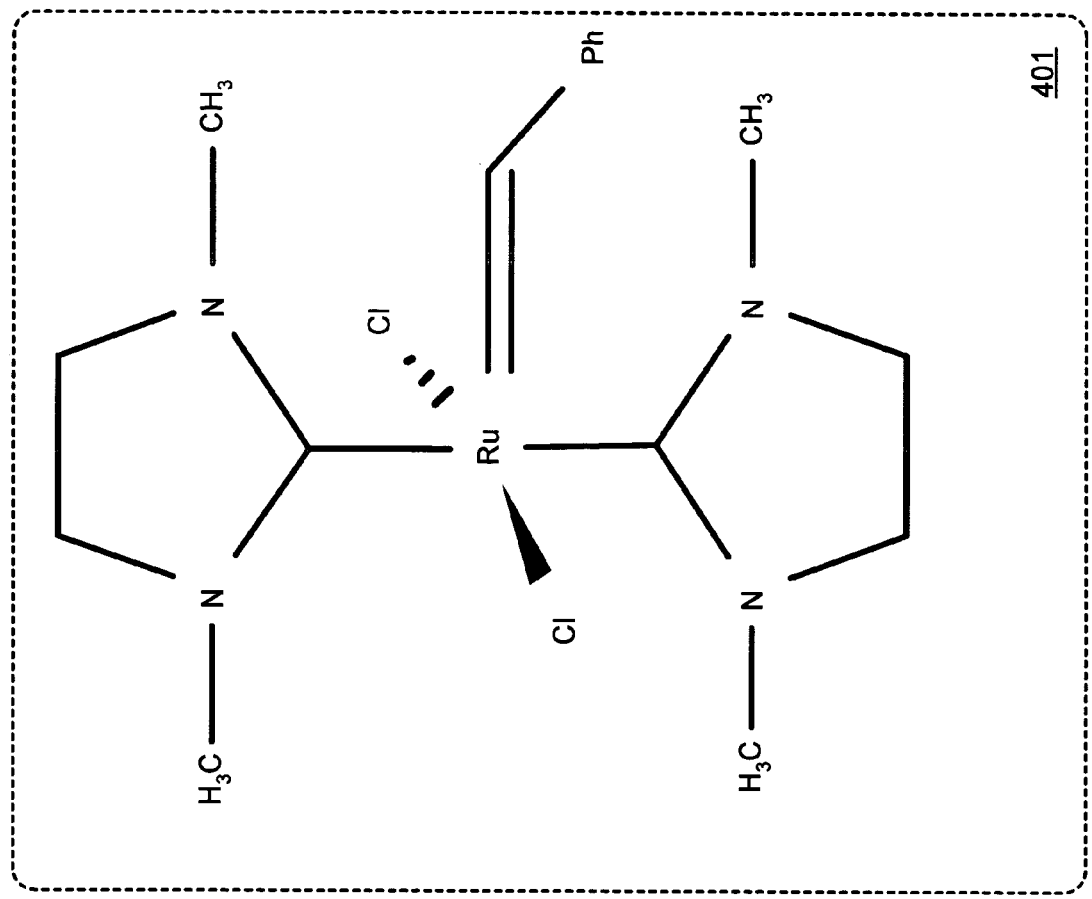
FIG. 4: illustration of a chemical structure of a ruthenium-based catalyst of an embodiment
Figure 5:
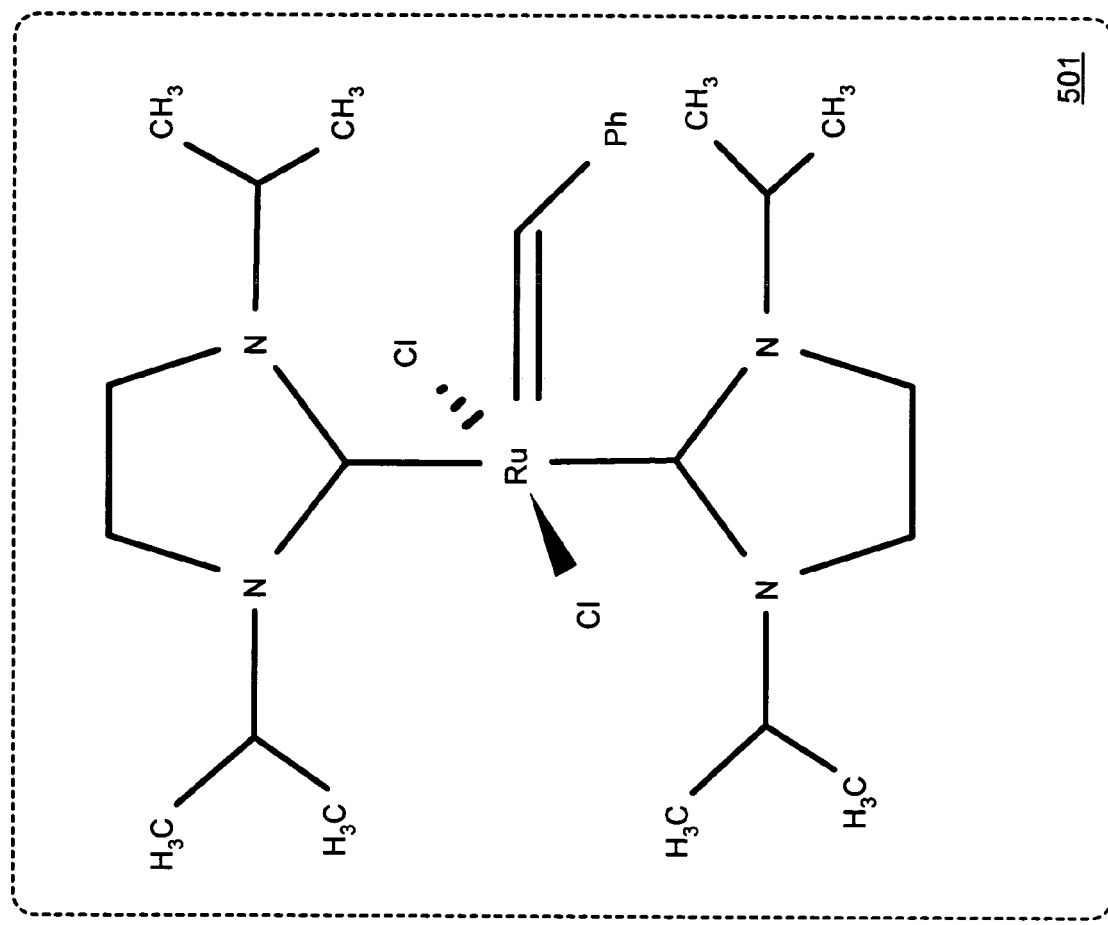
FIG. 5: illustration of the chemical structure of a ruthenium-based catalyst of another embodiment
Figure 6:
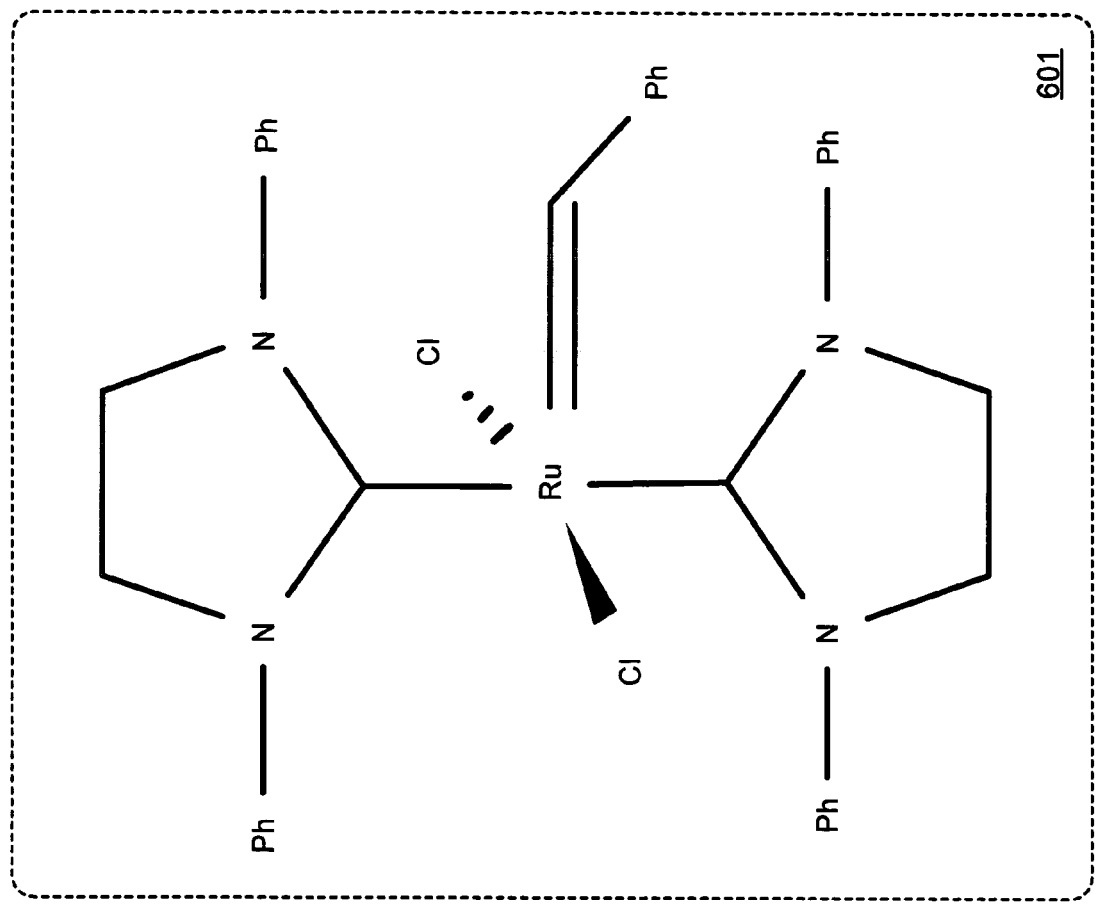
FIG. 6: illustration of the chemical structure of a ruthenium-based catalyst of yet another embodiment

FIG. 4 through FIG. 6 illustrate ruthenium-based catalysts of embodiments for which the R1 and R2 for the imidazol-2-ylidene (NHC) ligand group are altered to tune the temperature at which the catalyst becomes active. As noted, a less sterically bulky N-substituent will require a higher temperature to initiate spontaneous polymerization than a more sterically bulky N-substituent. Examples of less sterically bulky imidazol-2-ylidene ligands include catalyst 401 of FIG. 4 employing the 1,3-dimethyl-4,5-dihydroimidazol-2-ylidene ligand, catalyst 501 of FIG. 5 employing the 1,3-diisopropyl-4,5-dihydroimidazol-2-ylidene ligand, and catalyst 601 of FIG. 6 employing the 1,3-diphenyl-4,5-dihydroimidazol-2-ylidene ligand. The activation temperatures for ruthenium-based catalysts 401, 501, and 601 may be higher than for ruthenium-based catalyst 202.

The ruthenium-based catalysts of the general structure 301, including the specific ruthenium-based catalysts 202, 401, 501, and 601 allow the potential for cyclic olefin to be a commercially practicable replacement technology to epoxy-based materials. The curing rate can be very rapid and can also be controlled by a variety of methods. Materials with low and very tunable dielectric constants are easily accessible via metathesis polymerization for those semiconductor applications that would benefit from a packaging material that has a low dielectric constant. Further, while the mixtures of cyclic olefins and catalyst are stable at room temperature, they may nevertheless spontaneously polymerize at temperatures well below the cure temperatures of epoxy-based materials. The reduced temperature may be beneficial to semiconductor processes that would benefit from reduced exposure to high temperatures. For example, and among other devices, a polymer ferroelectric memory may be incompatible with current epoxy-based packaging schemes given the temperature sensitivity of the polymer ferroelectric.

An embodiment also consists of the preparation of stable mixtures of ruthenium-based catalysts 202, 401, 402, or 403 with cyclic olefins consisting of dicyclopentadiene, various substituted dicyclopentadiene-based molecules, norbornene, various substituted norbornenes, cyclooctene, various substituted cyclooctenes, and molecules containing two or more dicyclopentadiene, norbornene, or cyclooctene moieties. The catalyst loading could be from 1 ppm to 10% based on the amount and nature of the cyclic olefin monomers. The stable mixtures could also contain fillers such as silica and carbon black and various additives such as colorants, adhesion promoters, and stabilizers as required by the particular semiconductor application. These mixtures will be stable at room temperature and have shelf and pot lives useful for manufacturing purposes in the context of processes such as screen printing or valve/jet dispensing. Further, the addition of the various fillers and additives will not substantially interfere with the cyclic olefin metathesis polymerization reaction as catalyzed by ruthenium-based catalysts 202, 401, 501, and 601.

To prepare a ruthenium-based catalyst 202 of RuCl$_2$(SIMes)$_2$CHPh, commercially available RuCl$_2$(PCy$_3$)(SIMes)CHPh is added to an excess of pyridine in a vial and stirred for approximately five minutes at approximately room temperature during which time a color change from purple to green occurs. The solution is then layered with 20 volumes of pentane and cooled in a freezer overnight, during which time an intermediate product precipitates. The intermediate product is collected by filtration and dried in vacuum. Thereafter, the intermediate product (in an embodiment 0.075 g) is added to 8 mL of toluene with 0.173 g SIMes(H)(CCl3) (chloroform adduct of the NHC carbene) and heated to and maintained at approximately 80° C. for approximately 20 hours. The crude product is then purified by column chromatography.

The resulting ruthenium-based catalyst 202 fabricated with the aforementioned process can then be combined with a cyclic olefin monomer to generate a mixture of cyclic olefin monomer and catalyst that is stable (i.e., does not spontaneously polymerize) at a temperature and humidity that is common to storage, screen printing, valve/jet dispensing, and film lamination. In an embodiment, 25 g of dicyclopentadiene is mixed with 25 g of N,N'-dinorbornenyl-1,4-diaminobenzene, 50 g spherical silica filler, and 0.01 g of the ruthenium-based catalyst 202 of an embodiment are mixed in a double planetary mixer or other dispersing mixer at room temperature and passed through a three roll mill.

It is to be understood that the preparation of ruthenium-based catalysts of alternate embodiments (e.g., ruthenium based catalysts 401, 501, and 601) may be prepared in an analogous manner as ruthenium-based catalyst 202 as detailed above using 1,3-dimethyl-4,5-dihydroimidazol-2-ylidene, 1,3-diisopropyl-4,5-dihydroimidazol-2-ylidene, and 1,3-diphenyl-4,5-dihydroimidazol-2-ylidene, respectively. Further, while the preparation of the stable cyclic olefin and ruthenium-based catalyst has been described with reference to dicyclopentadiene, it is to be understood that substituted dicyclopentadiene-based molecules, norbornene, various substituted norbornenes, cyclooctene, various substituted cyclooctenes, and molecules containing two or more dicyclopentadiene, norbornene, or cyclooctene moieties may be used as a constituent or constituents of the cyclic olefin polymer. Finally, though the process has been described with reference to specific masses and volumes, that other mass and volume combinations (i.e., approximately comparable concentrations) may be used.

The mixtures of cyclic olefin monomers, additives (if any, depending on embodiment), and ruthenium-based catalyst (i.e., ruthenium-based catalyst 202, 401, 501, or 601) can then be applied to a semiconductor device or semiconductor device containing substrate in a variety of ways and polymerization can be initiated thermally by heating the device or substrate to which the cyclic olefin monomer mixture has been applied to an elevated temperature. In an embodiment utilizing one of the ruthenium-based catalysts 202, 401, 501, or 601, the temperature required to initiate ROMP is approximately between 40° C. and 250° C. The methods of applying the cyclic olefin monomer and ruthenium-based catalyst mixture will be compatible with those processes currently used for epoxies, for example, where the mixture can be worked into the desired form or space by a number of methods known in the art in a reasonable time frame in typical factory conditions without exclusion of air and moisture.

Figure 7:
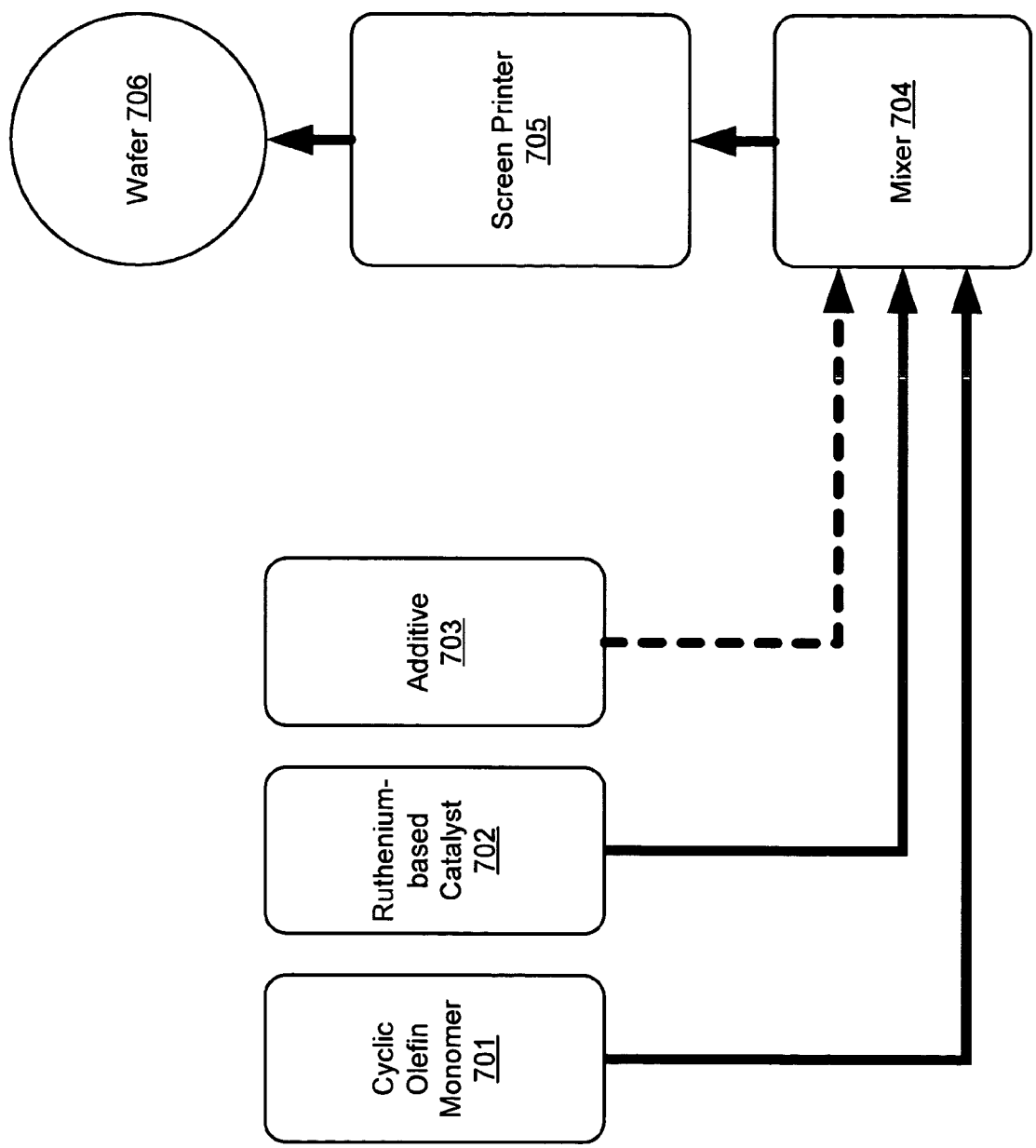
FIG. 7: illustration of a screen printer cyclic olefin deposition process
Figure 8:
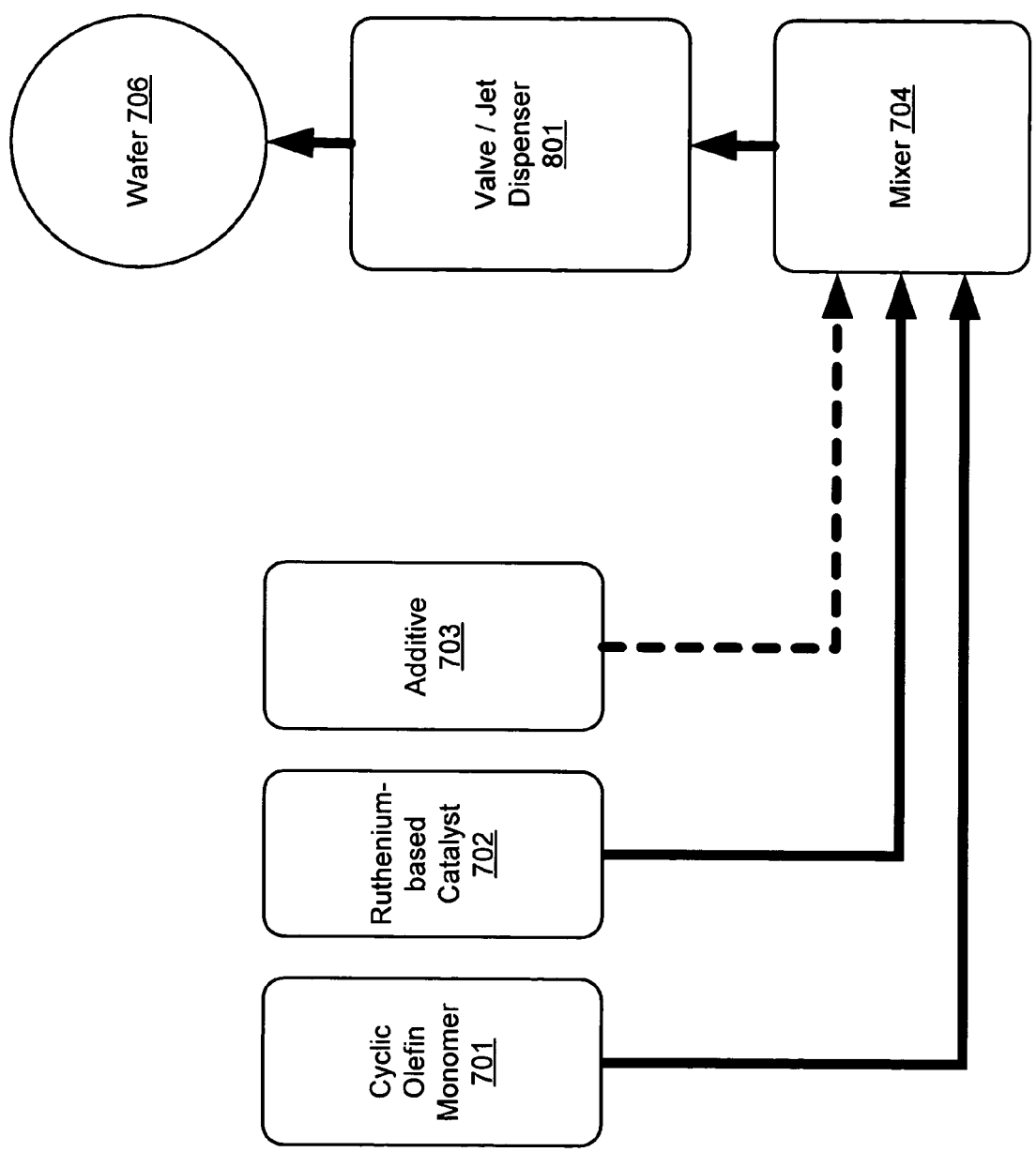
FIG. 8: illustration of a valve/jet cyclic olefin deposition process
Figure 9:
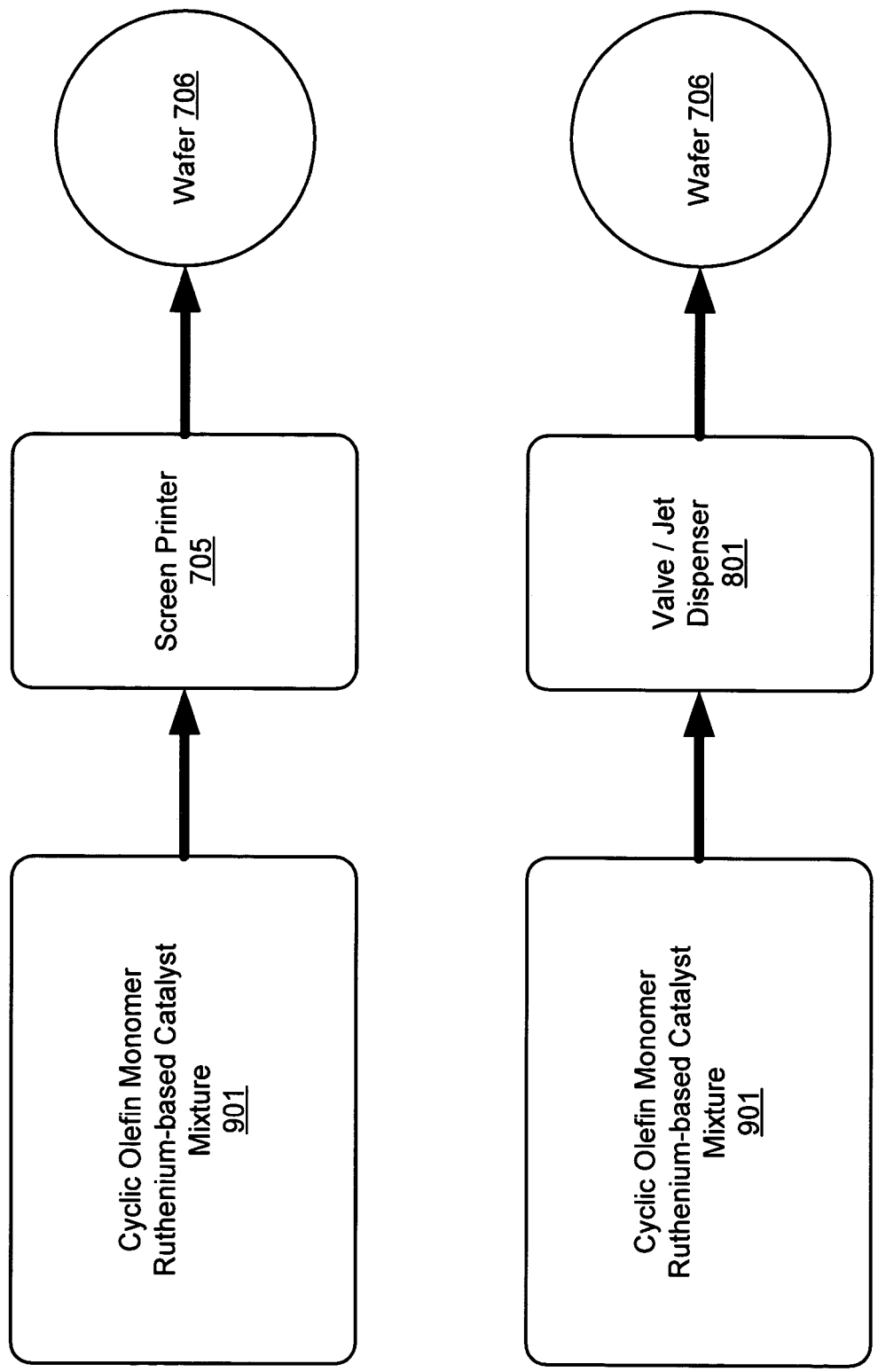
FIG. 9: illustration of a cyclic olefin screen printer deposition process and a cyclic olefin valve/jet deposition process of a premixed cyclic olefin and ruthenium-based catalyst

Specifically, FIG. 7, FIG. 8, and FIG. 9 illustrate cyclic olefin monomer and ruthenium-based catalyst mixture deposition processes of embodiments. FIG. 7 illustrates a cyclic olefin monomer 701 and a ruthenium-based catalyst 702 (e.g., ruthenium-based catalyst 202, 401, 501, or 601) mixing in a mixer 704 and passed to a screen printer 705 in which the mixture of the cyclic olefin monomer 701 and a ruthenium-based catalyst 702 will be screen print deposited in a particular pattern to package a semiconductor device on wafer 706. In an embodiment, the mixture further includes an additive 703 as described above. FIG. 8 illustrates the same cyclic olefin monomer 701 and ruthenium-based catalyst 702 (e.g., ruthenium-based catalyst 202, 401, 501, or 601) mixing in a mixer 704 and in an embodiment including an additive 703. The embodiment illustrated by FIG. 8 valve or jet prints (i.e. sprays) the mixture in a particular pattern to package a semiconductor device on wafer 706. FIG. 9 illustrates the deposition processes of FIGS. 7 and 8 including an embodiment utilizing a premixed cyclic olefin monomer and ruthenium-based catalyst mixture 901, emphasizing the stability (i.e., enhanced shelf life and pot life) of the mixture.

The wafer 706 may then be heated to a temperature of approximately between 40° C. and 250° C. for approximately between 1 and 6 hours to activate the ruthenium-based catalyst 702 and polymerize the cyclic olefin monomer 701 (and in an embodiment, the premixed cyclic olefin monomer and ruthenium-based catalyst mixture 901) to fabricate a cyclic olefin semiconductor package on wafer 706

Figure 10:
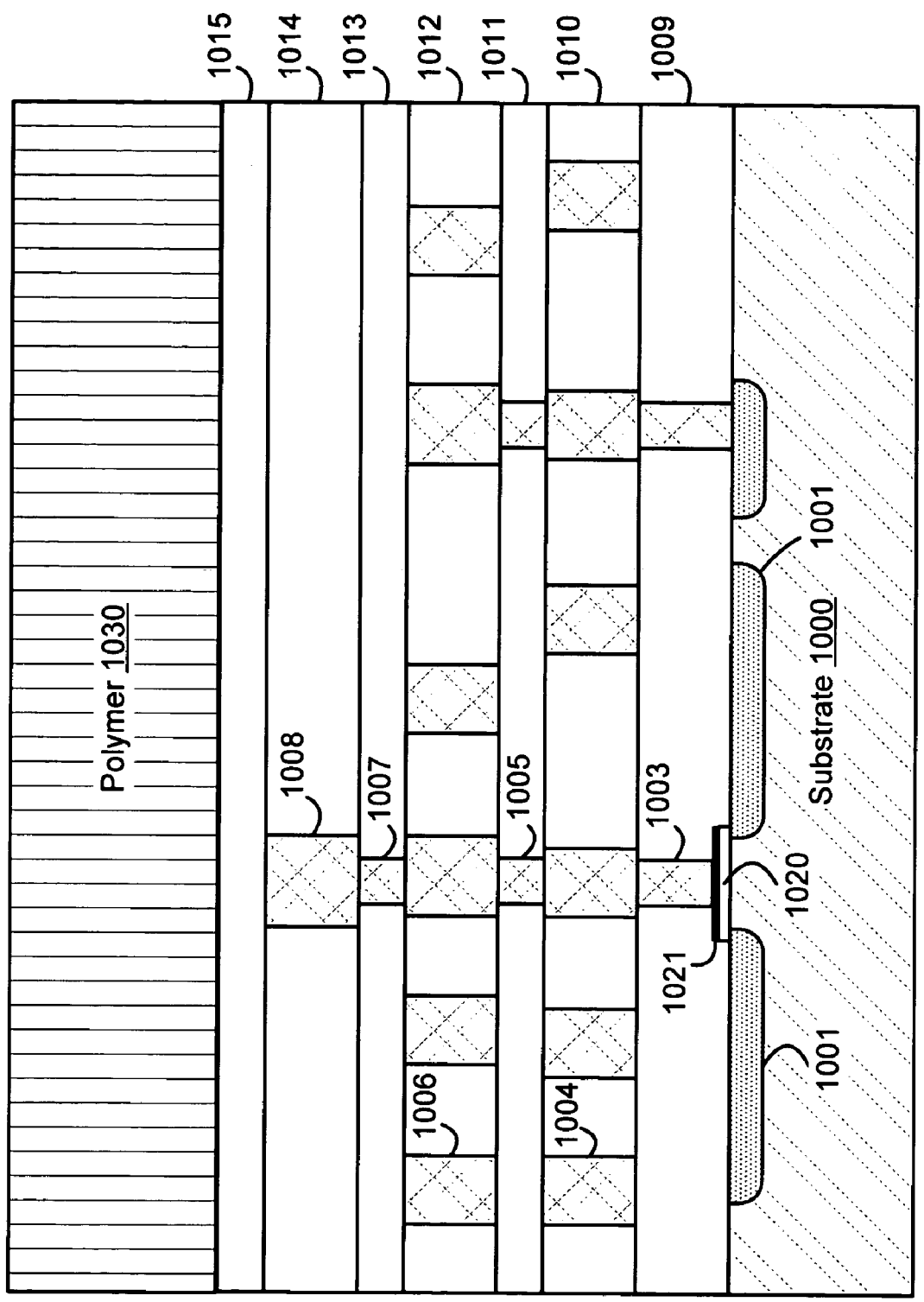
FIG. 10: illustration of a cyclic olefin polymer as a semiconductor package

FIG. 10 illustrates a substrate cross section including a cyclic olefin package. More specifically, and as an example only, FIG. 10 illustrates a cross section of a copper dual-damascene architecture utilizing a low-k interlayer dielectric ("ILD"). A substrate 1000 contains any variety of semiconductor devices well known to those skilled in the art as represented rudimentarily by source and drain regions 1001, dielectric 1020, and gate 1021 of a metal oxide semiconductor ("MOS") transistor. Interconnect levels 1004, 1006, and 1008 are representative of, for example, the trench level of a copper dual-damascene interconnect structure, for which via levels 1003, 1005, and 1007 provide electrical contact between interconnect layers and between interconnect layers and semiconductor devices. ILD layers 1009 through 1014 may be formed of low-k dielectric material. The ILDs 1009 through 1014 not only isolate interconnects on different layers, but also isolate interconnects on the same layer. Passivation layer 1015 completes the interconnect stack. Polymer 1030 packages the substrate 1000 and subsequent layers in a cyclic olefin utilizing the processes and materials of embodiments introduced above.

One skilled in the art will recognize the elegance of an embodiment as it mitigates the room temperature ROMP of cyclic olefins, more easily facilitating the incorporation of cyclic olefins in semiconductor packaging process flows. An embodiment further reduces the temperature required to fabricate the package in comparison to epoxy cure temperatures common in the art to protect temperature sensitive semiconductor devices.

What is claimed is:

1. A method of semiconductor packaging comprising:
mixing a cyclic olefin monomer with a ruthenium-based catalyst;
depositing the mixture of cyclic olefin monomer and ruthenium-based catalyst on a substrate including a semiconductor device;
heating the mixture of cyclic olefin monomer and ruthenium-based catalyst to form a cyclic olefin package on the semiconductor device.

2. The method of claim 1, heating the mixture of cyclic olefin monomer and ruthenium-based catalyst further comprising:
initiating a ring opening metathesis polymerization.

3. The method of claim 2, depositing the mixture of cyclic olefin monomer and ruthenium-based catalyst further comprising screen printing the mixture.

4. The method of claim 3, depositing the mixture of cyclic olefin monomer and ruthenium-based catalyst further comprising valve depositing the mixture.

5. The method of claim 4, depositing the mixture of cyclic olefin monomer and ruthenium-based catalyst further comprising jet depositing the mixture.

6. The method of claim 2 wherein the cyclic olefin monomer comprises a compound selected from the group consisting of dicyclopentadiene, substituted dicyclopentadiene, norbornene, substituted norbornene, cyclooctene, substituted cyclooctene, and combinations thereof.

7. The method of claim 2 wherein the ruthenium-based catalyst has a formula of $RuX_2L_2CR1R2$ for which:
X includes a halogen or alkoxide group,
L is a member of the imidazol-2-ylidene ligand group with N-substituents,
R1 includes a hydrogen, an aryl group, a branched alkyl group, or a linear alkyl group;
and
R2 is a imidazol-2-ylidene ring substituent and includes a hydrogen, an aryl group, a branched alkyl group, or a linear alkyl group.

8. The method of claim 7 wherein C3 and C4 of the R2 imidazol-2-ylidene ring is substituted with groups selected from the group consisting of hydrogen, aryl, ester, carboxylic acid, amine, amide, a linear hydrocarbon, and a branched hydrocarbon, and a combination thereof.

9. The method of claim 1, heating the mixture of cyclic olefin monomer and ruthenium-based catalyst further comprising:

activating the polymerization of the mixture of cyclic olefin monomer and ruthenium-based catalyst by maintaining the mixture of cyclic olefin monomer and ruthenium-based catalyst at approximately between 40° C. and 250° C. for approximately between 1 and 6 hours.

10. A method comprising:

depositing a mixture of cyclic olefin monomer and ruthenium-based catalyst on a substrate including a semiconductor device;

initiating a ring opening metathesis polymerization in the mixture of cyclic olefin monomer and ruthenium-based catalyst to form a cyclic olefin package on the semiconductor device.

11. The method of claim 10 wherein the cyclic olefin monomer comprises a compound selected from the group consisting of dicyclopentadiene, substituted dicyclopentadiene, norbornene, substituted norbornene, cyclooctene, substituted cyclooctene, and a combination thereof.

12. The method of claim 10 wherein the ruthenium-based catalyst has a formula of $RuX_2L_2CR1R2$ for which:

X includes a halogen or alkoxide group,

L is a member of the imidazol-2-ylidene ligand group with N-substituents,

R1 includes a hydrogen, an aryl group, a branched alkyl group, or a linear alkyl group;

and

R2 is a imidazol-2-ylidene ring substituent and includes a hydrogen, an aryl group, a branched alkyl group, or a linear alkyl group.

13. The method of claim 12 wherein C3 and C4 of the R2 imidazol-2-ylidene ring is substituted with groups selected from the group consisting of hydrogen, aryl, ester, carboxylic acid, amine, amide, a linear hydrocarbon, and a branched hydrocarbon, and a combination thereof.

14. The method of claim 10, initiating a ring opening metathesis polymerization in the mixture of cyclic olefin monomer and ruthenium-based catalyst further comprising:

heating the mixture of cyclic olefin monomer and ruthenium-based catalyst to a temperature approximately between 40° C. and 250° C.; and maintaining the temperature for approximately between 1 and 6 hours.

* * * * *